US012532791B1

(12) United States Patent
Young et al.

(10) Patent No.: US 12,532,791 B1
(45) Date of Patent: Jan. 20, 2026

(54) MULTI-DIE SEMICONDUCTOR WAFER USING SILICON WAFER SUBSTRATE EMBEDMENT

(71) Applicant: Honeywell Federal Manufacturing & Technologies, LLC, Kansas City, MO (US)

(72) Inventors: Barbara Diane Young, Raymore, MO (US); Steven James Sedlock, Raymore, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 19/186,366

(22) Filed: Apr. 22, 2025

(51) Int. Cl.
*H01L 25/00* (2006.01)
*H01L 21/3065* (2006.01)
*H01L 23/00* (2006.01)
*H01L 23/367* (2006.01)
*H01L 25/065* (2023.01)

(52) U.S. Cl.
CPC .......... *H01L 25/50* (2013.01); *H01L 21/3065* (2013.01); *H01L 23/367* (2013.01); *H01L 24/19* (2013.01); *H01L 24/20* (2013.01); *H01L 24/24* (2013.01); *H01L 24/32* (2013.01); *H01L 24/73* (2013.01); *H01L 24/82* (2013.01); *H01L 24/83* (2013.01); *H01L 25/0655* (2013.01); *H01L 2224/19* (2013.01); *H01L 2224/215* (2013.01); *H01L 2224/24137* (2013.01); *H01L 2224/32237* (2013.01); *H01L 2224/73267* (2013.01); *H01L 2224/82101* (2013.01); *H01L 2224/83893* (2013.01); *H01L 2924/3511* (2013.01)

(58) Field of Classification Search
CPC . H01L 25/50; H01L 25/0655; H01L 21/3065; H01L 23/367; H01L 24/19; H01L 24/30; H01L 24/24; H01L 24/32; H01L 24/73; H01L 24/82; H01L 24/83
USPC ........................................................ 257/678
See application file for complete search history.

(56) References Cited

U.S. PATENT DOCUMENTS

| 10,559,525 | B2 | 2/2020 | Yu | |
|---|---|---|---|---|
| 2008/0157316 | A1* | 7/2008 | Yang | ........................ H01L 24/82 257/685 |
| 2012/0146177 | A1* | 6/2012 | Choi | ........................ H01L 24/97 257/528 |

FOREIGN PATENT DOCUMENTS

| CN | 110416091 A | 11/2019 |
|---|---|---|
| CN | 114551254 A | 5/2022 |
| CN | 115547859 A | 12/2022 |

* cited by examiner

*Primary Examiner* — Jasmine J Clark
(74) *Attorney, Agent, or Firm* — Erise IP, P.A.

(57) ABSTRACT

A method for fabricating a semiconductor wafer may etch a surface of a silicon substrate to form a first cavity and a second cavity. The method may apply a first dielectric layer to the surface of the silicon substrate, the first cavity, and the second cavity. The method may affix a first die into the first cavity of the silicon substrate. The method may affix a second die into the second cavity of the silicon substrate. The method may apply a second dielectric layer to the surface of the silicon substrate, an exposed surface of the first die, and an exposed surface of the second die. The method may form a redistribution layer over the second dielectric layer, where the redistribution layer is configured to electrically couple the first die to the second die.

20 Claims, 7 Drawing Sheets

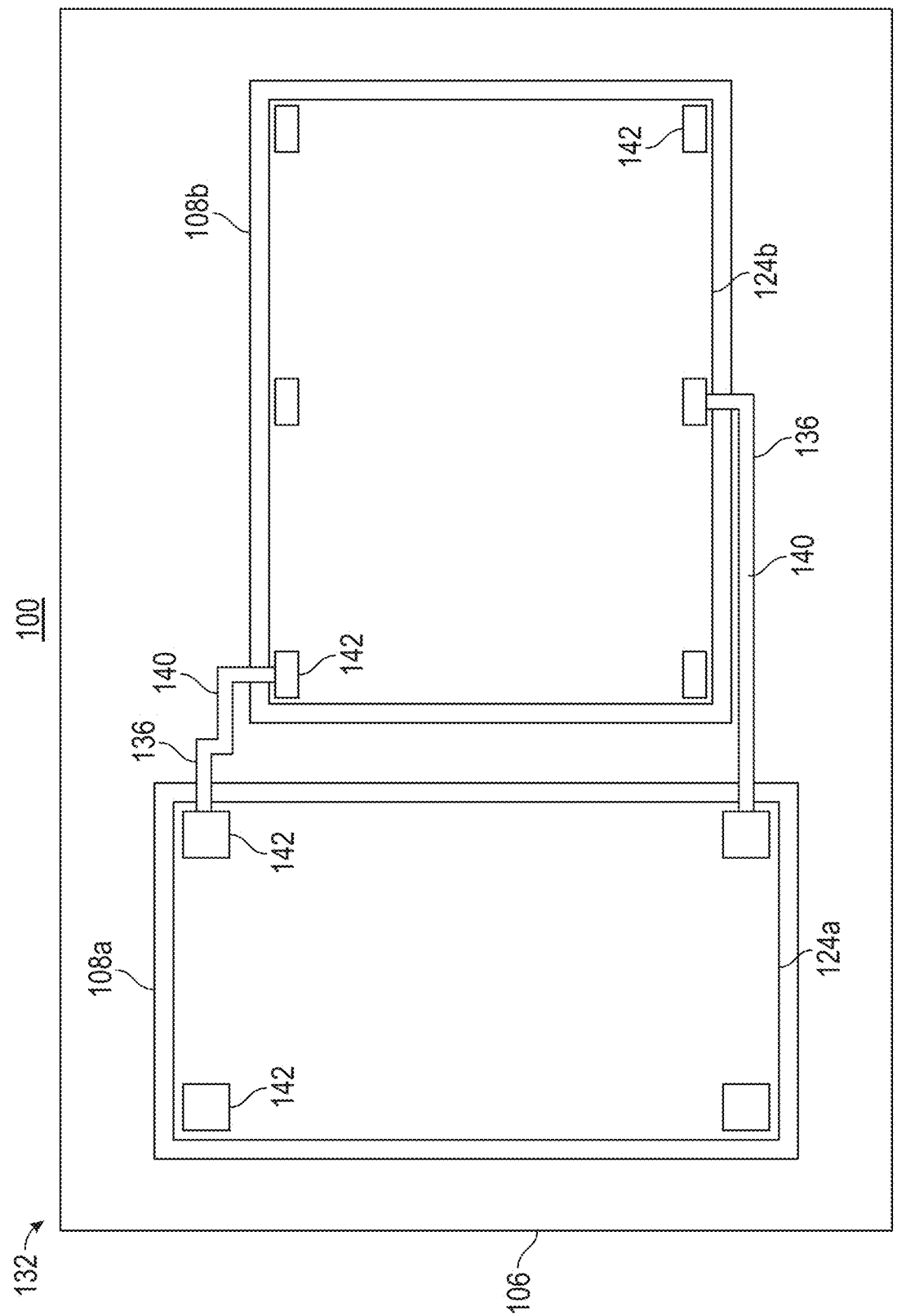

MULTI-DIE SEMICONDUCTOR WAFER USING SILICON WAFER SUBSTRATE EMBEDMENT

STATEMENT OF GOVERNMENT SUPPORT

This invention was made with government support under contract number DE-NA-0002839 awarded by the United States Department of Energy/National Nuclear Security Administration. The government has certain rights in the invention.

BACKGROUND

1. Field

Embodiments of the present disclosure relate to the fabrication of semiconductor components. More specifically, embodiments of the present disclosure relate to the fabrication of multi-die semiconductor wafers using substrate embedment.

2. Related Art

Most current wafer-level fan-out (WLFO) microelectronics fabrication processes rely on wafers composed of epoxy mold compound (EMC). This process includes the molding of EMC around the die to create a multi-die wafer. While this process enables the integration of multiple dies and supports redistribution layers (RDL) for interconnects, significant challenges arise during and after manufacturing. The curing process for the mold compound introduces warpage and die drift, compromising the precision and alignment of the components. These issues necessitate additional process steps and engineering efforts to mitigate misalignments.

Furthermore, the mismatch in the coefficient of thermal expansion (CTE) between the die materials and the mold compound creates additional stress during thermal cycling. This mismatch can result in reliability issues, such as cracks or deformation, which degrade the performance and longevity of the final product. There is a present need for innovative solutions to minimize material mismatches, mitigate warpage and die drift, and streamline the overall process of manufacturing a multi-die semiconductor wafer to enhance yield and reliability.

SUMMARY

Embodiments of the present disclosure solve the above-mentioned problems by providing a method for fabricating a semiconductor wafer using substrate embedment. In some aspects, the techniques described herein relate to a method for fabricating a semiconductor wafer via substrate embedment, the method including: etching a surface of a silicon substrate, based on a predetermined pattern, to form a first cavity and a second cavity; applying a first dielectric layer to the surface of the silicon substrate, the first cavity, and the second cavity; affixing a first die into the first cavity of the silicon substrate using a first adhesive; affixing a second die into the second cavity of the silicon substrate using a second adhesive; applying a second dielectric layer to the surface of the silicon substrate, an exposed surface of the first die, and an exposed surface of the second die; forming one or more openings in the second dielectric layer by: applying a first photoresist layer over the second dielectric layer; exposing at least a portion of the first photoresist layer to ultraviolet (UV) light; patterning at least a portion of the second dielectric layer such that a desired dielectric pattern is formed, wherein the desired dielectric pattern forms the one or more openings above the exposed surface of the first die and the exposed surface of the second die; and stripping remaining portions of the first photoresist layer from the second dielectric layer; and forming a redistribution layer over the second dielectric layer by: applying a metal layer over the second dielectric layer and the one or more openings; applying a second photoresist layer over the metal layer; exposing at least a portion of the second photoresist layer to UV light; patterning at least a portion of the metal layer such that a desired metal pattern is formed, wherein the desired metal pattern is configured to electrically couple the first die to the second die; and stripping remaining portions of the second photoresist layer from the metal layer.

In some aspects, the techniques described herein relate to a method, wherein the first die is distinct from the second die.

In some aspects, the techniques described herein relate to a method, wherein the first die is a gallium arsenide die.

In some aspects, the techniques described herein relate to a method, wherein the surface of the silicon substrate is etched by deep reactive ion etching.

In some aspects, the techniques described herein relate to a method, wherein the first dielectric layer is formed of thermal oxide.

In some aspects, the techniques described herein relate to a method, wherein the second dielectric layer is formed of an inorganic dielectric material.

In some aspects, the techniques described herein relate to a method, wherein the redistribution layer couples the first die to the second die via electrically coupling a first contact pad of the first die to a second contact pad of the second die.

In some aspects, the techniques described herein relate to a method for fabricating a semiconductor wafer via substrate embedment, the method including: etching a surface of a silicon substrate to form a first cavity and a second cavity; affixing a first die into the first cavity of the silicon substrate; affixing a second die into the second cavity of the silicon substrate, wherein the first die is distinct from the second die; applying a dielectric layer to the surface of the silicon substrate, an exposed surface of the first die, and an exposed surface of the second die, wherein the dielectric layer is an inorganic dielectric material; forming one or more openings in the dielectric layer by: applying a first photoresist layer over the dielectric layer; exposing at least a portion of the first photoresist layer to ultraviolet (UV) light; patterning at least a portion of the dielectric layer such that a desired dielectric pattern is formed, wherein the desired dielectric pattern forms the one or more openings above the exposed surface of the first die and the exposed surface of the second die; and stripping remaining portions of the first photoresist layer from the dielectric layer; and forming a redistribution layer over the dielectric layer by: applying a metal layer over the dielectric layer and the one or more openings; applying a second photoresist layer over the metal layer; exposing at least a portion of the second photoresist layer to UV light; patterning at least a portion of the metal layer such that a desired metal pattern is formed, wherein the desired metal pattern is configured to electrically couple the first die to the second die; and stripping remaining portions of the second photoresist layer from the metal layer.

In some aspects, the techniques described herein relate to a method, wherein the inorganic dielectric material is plasma enhanced tetraethyl orthosilicate (PETEOS).

In some aspects, the techniques described herein relate to a method, wherein the first die is a silicon carbide die.

In some aspects, the techniques described herein relate to a method, further including: etching the surface of the silicon substrate to form a third cavity; affixing a third die into the third cavity of the silicon substrate; applying the dielectric layer to an exposed surface of the third die; forming additional one or more openings in the dielectric layer applied to the exposed surface of the third die; and electrically coupling, via the redistribution layer, the third die to at least the first die or the second die.

In some aspects, the techniques described herein relate to a method, further including: etching the surface of the silicon substrate to form a third cavity, wherein the third cavity extends at least partially through the silicon substrate to form a through-silicon via (TSV).

In some aspects, the techniques described herein relate to a method, wherein the first die is thermally coupled to a heat sink via the TSV.

In some aspects, the techniques described herein relate to a method, wherein the first die is affixed to the first cavity by anodic bonding.

In some aspects, the techniques described herein relate to a semiconductor wafer, including: a silicon substrate; a first cavity etched into a surface of the silicon substrate; a second cavity etched into the surface of the silicon substrate a first dielectric layer covering the surface of the silicon substrate, the first cavity, and the second cavity; a first die affixed to the first cavity; a second die affixed to the second cavity, wherein the first die is distinct from the second die; a second dielectric layer at least partially covering the surface of the silicon substrate, an exposed surface of the first die, and an exposed surface of the second die, wherein the second dielectric layer is formed of an inorganic dielectric material; and a redistribution layer at least partially covering the second dielectric layer, wherein a first contact pad of the first die is electrically coupled to a second contact pad of the second die via one or more openings in the second dielectric layer.

In some aspects, the techniques described herein relate to a semiconductor wafer, wherein the first die is a gallium arsenide die.

In some aspects, the techniques described herein relate to a semiconductor wafer, further including: an additional semiconductor wafer, including: an additional silicon substrate; an additional first cavity etched into a surface of the additional silicon substrate; and an additional second cavity etched into the surface of the additional silicon substrate, wherein the semiconductor wafer and the additional semiconductor wafer are electrically coupled to form a stacked semiconductor structure.

In some aspects, the techniques described herein relate to a semiconductor wafer, wherein the stacked semiconductor structure includes a through-silicon via (TSV) extending at least partially through the stacked semiconductor structure.

In some aspects, the techniques described herein relate to a semiconductor wafer, wherein at least one die of the stacked semiconductor structure is thermally coupled to a heat sink via the TSV.

In some aspects, the techniques described herein relate to a semiconductor wafer, wherein at least one die of the semiconductor wafer is electrically coupled to at least one die of the additional semiconductor wafer via a TSV.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present disclosure will be apparent from the following detailed description of the embodiments and the accompanying drawing figures.

BRIEF DESCRIPTION OF THE DRAWING FIGURES

Embodiments of the present disclosure are described in detail below with reference to the attached drawing figures, wherein:

FIG. 1G illustrates a top-down cross-sectional view of forming a redistribution layer during a step of a method for fabricating a semiconductor wafer;

Figure 1A:
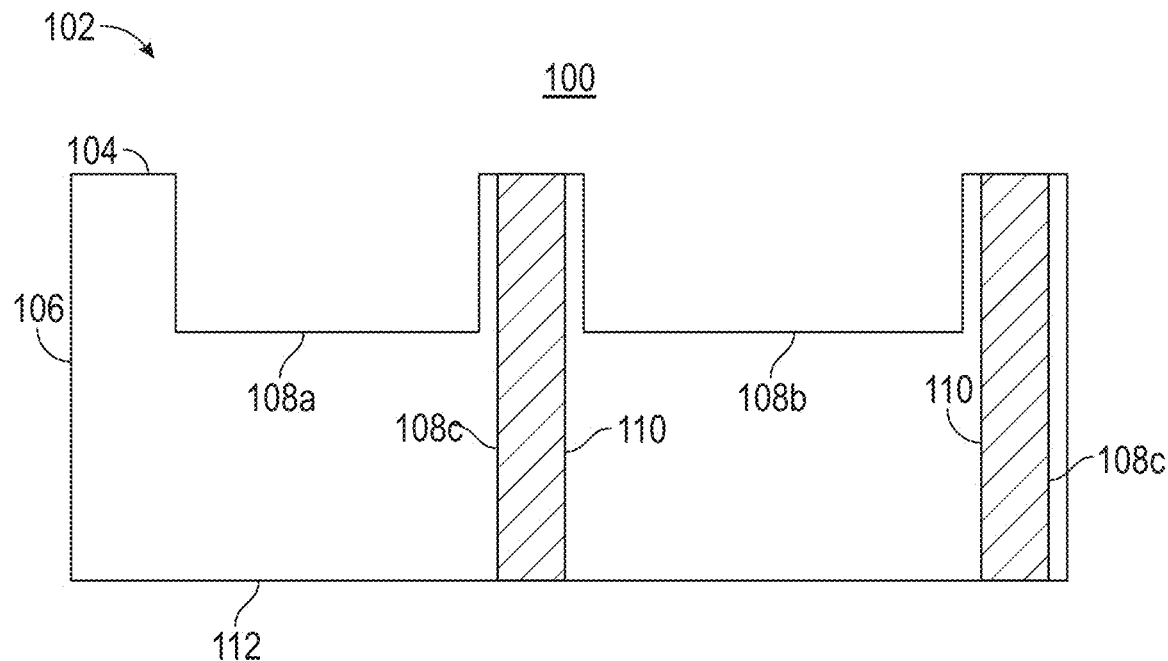
FIG. 1A illustrates an exemplary step of etching a substrate during a method for fabricating a semiconductor wafer.

The drawing figures do not limit the present disclosure to the specific embodiments disclosed and described herein. The drawings are not necessarily to scale, emphasis instead being placed upon clearly illustrating the principles of the present disclosure.

DETAILED DESCRIPTION

The following detailed description references the accompanying drawings that illustrate specific embodiments in which the present disclosure can be practiced. The embodiments are intended to describe aspects of the present disclosure in sufficient detail to enable those skilled in the art to practice the present disclosure. Other embodiments can be utilized, and changes can be made without departing from the scope of the present disclosure. The following detailed description is, therefore, not to be taken in a limiting sense. The scope of the present disclosure is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc., described in one embodiment may also be included in other embodiments but is not necessarily included. Thus, the technology can include a variety of combinations and/or integrations of the embodiments described herein.

In this description, references to "electrically coupled," or similar terms, refer to a connection or relationship between two or more electrical components, elements, or structures that allows the transfer of electrical signals, power, or current between them. This connection may be direct, such as through a physical conductive pathway (e.g., a wire, trace, or solder joint), or indirect, such as through capacitive, inductive, or other forms of coupling. The term encompasses both permanent and temporary connections and does not necessarily require direct physical contact between the coupled elements. Additionally, "electrically coupled," or similar terms, includes configurations that enable signal or power transfer through intermediate components, circuitry, or media.

Embodiments of the present disclosure relate to the fabrication of improved multi-die semiconductor wafers, addressing limitations associated with conventional fabrication methods, such as methods that utilize wafers made from epoxy mold compound (EMC). For example, embodiments of the present disclosure include a semiconductor wafer fabrication method designed to mitigate common challenges, including warpage, die drift, misalignment, and cracking, which result from the CTE mismatch between the die materials and the EMC. For instance, embodiments of the present disclosure include etching the surface of a substrate to form one or more cavities. One or more dies may be affixed to each of the one or more cavities. Further, additional layers, such as a dielectric layer and a redistribution layer, may be applied to the substrate, one or more cavities, and one or more dies such that dies are electrically coupled to form a reliable semiconductor wafer. Additionally, by embedding dies into a substrate and holding the dies in place via the embedment, there is no EMC to cure, further eliminating the issue of die drifting.

Additional embodiments of the present disclosure include using a silicon substrate as the substrate. Advantageously, using silicon as the substrate material may reduce issues such as warpage, die drift, misalignment, and cracking during and after the fabrication process of the semiconductor wafer. For example, the primary cause of these problems, as currently seen in wafers made from EMC, is the mechanical stress generated by the mismatch in CTE between the dies and the substrate material, particularly during thermal cycling, curing, or subsequent processing steps. When the substrate and the dies expand or contract at different rates, this stress can deform the wafer, resulting in warpage or causing the dies to shift from their intended positions (die drift), leading to misalignment. Moreover, excessive stress at the interfaces between the die and substrate can initiate or propagate cracks, compromising the structural integrity and reliability of the semiconductor device. By selecting a substrate material with a CTE closely matching that of the dies, such as silicon, these stresses are minimized, leading to a more stable wafer, improved alignment accuracy, and enhanced mechanical and thermal reliability of the final product.

Broadly, FIGS. 1A-1G illustrate the steps of an exemplary process for fabricating a semiconductor wafer in accordance with embodiments of the invention that is generally referred to as process 100. Process 100 may be performed using any number of the steps disclosed below and in any order.

FIG. 1A illustrates an exemplary step of process 100. Process 100 generally begins at step 102, where a surface 104 of a substrate 106 may be etched to form one or more cavities such as first cavity 108a and second cavity 108b. In some embodiments, substrate 106 is a silicon substrate. For instance, substrate 106 may be partially or completely comprised of silicon. Advantageously, using silicon material for substrate 106 may allow substrate 106 to have a CTE that is similar to the CTE of one or more dies affixed to one or more cavities (as discussed below in step 122 of FIG. 1D) to mitigate issues like die drift, warpage, and misalignment that can be seen during the thermal curing process in semiconductor manufacturing. For example, one or more dies may be embedded into substrate 106, and as part of the manufacturing process of a semiconductor, the substrate may undergo thermal cycling or curing at elevated temperatures. If substrate 106 has a CTE that closely matches the silicon dies (e.g., silicon-on-silicon systems), both the dies and substrate 106 will expand and contract at nearly the same rate as the temperature changes. This uniform thermal expansion prevents the generation of significant internal stresses that can cause substrate 106 to warp or the dies to shift from their original positions. As a result, the alignment of the dies remains accurate, ensuring precise connections during subsequent redistribution layer (RDL) formation or interconnect processing.

By contrast, if substrate 106 has a much higher or lower CTE than the dies (e.g., epoxy mold compounds mismatched with silicon dies), the mismatch in expansion rates would create differential stresses, potentially leading to warpage of substrate 106, die misalignment, or even cracking at the interfaces between substrate 106 and the dies. Thus, using a silicon substrate as substrate 106 minimizes these issues, improving the overall stability, precision, and reliability of the multi-die semiconductor wafer fabricated by process 100. In some embodiments, substrate 106 may be comprised of aluminum oxide or aluminum nitride. In other embodiments, substrate 106 may be comprised of gallium arsenide, silicon carbide, gallium nitride, silicon dioxide, ceramic, or any other suitable substrate material. Substrate 106 may further include embedded passive components, such as resistors or capacitors.

In some embodiments, cavities may be etched into any surface 104 of substrate 106 (e.g., substrate embedment). For example, a top, bottom, and/or side surface of substrate 106 may be etched to form one of first cavity 108a and second cavity 108b. For example, surface 104 may be etched to form a first cavity 108a and a second cavity 108b. The present disclosure is not limited to two such cavities, and surface 104 may be etched to form any number of cavities. For instance, a single cavity may be etched into surface 104, or a plurality (e.g., 50 cavities) may be etched into surface 104.

In some embodiments, cavities extend partially through substrate 106. In other embodiments, cavities extend substantially or completely through substrate 106. For example, surface 104 may be etched to form a cavity that extends all the way through substrate 106. In some embodiments, cavities include through-silicon vias (TSVs). For example, a through cavity 108c may be etched to form an instance of TSVs 110 for interconnecting different layers of substrate 106 or enabling backside contacts. For instance, TSVs 110 may include partial TSVs or a full TSVs to meet specific functional requirements. A partial TSV may be a partially etched instance of TSVs 110 through cavity 108c that does not extend completely through substrate 106. Instead, the partial TSV penetrates substrate 106 only partway, stopping before reaching a backside 112 of substrate 106. The partial TSV may be filled with a conductive material (e.g., copper)

or coated to form an electrical path. For example, the partial TSV may interconnect (e.g., electrically couple) dies or circuits within substrate 106 or enable lateral signal routing between dies or circuits within substrate 106. Additionally, TSVs 110 may be insulated from substrate 106 using dielectric material.

A Full TSV instance of TSVs 110 may be a through cavity 108*c* that extends completely through substrate 106 and reaches backside 112 of substrate 106, providing a direct electrical path from the frontside of substrate 106 to backside 112 of substrate 106. The Full TSV may be filled with conductive material (e.g., copper or tungsten) to create vertical interconnects that enable backside contacts. For example, the full TSV may facilitate connections to heat sinks, power delivery systems, or other electrical components, such as additional semiconductor wafers in stacked die configurations (as discussed later in FIG. 2 below). For example, the full TSV may provide a direct thermal and electrical pathway to connect an active layer of substrate 106 to backside 112 to improve thermal management (e.g., heating or cooling) of the semiconductor wafer fabricated from process 100. In another example, the full TSV may connect substrate 106 to additional semiconductor wafers or dies, enabling multi-layer integration in 3D integrated circuit architectures.

TSVs 110, full or partial, may additionally allow additional functionality of the semiconductor wafer by vertically integrating distinct semiconductor dies embedded within substrate 106 such as operational amplifier dies, voltage regulator dies, analog-to-digital converter dies, digital-to-analog converter dies, memory dies (e.g., DRAM dies or SRAM dies), logic processor dies (e.g., MPU dies or ASIC dies), digital signal processor dies, system-on-chip dies, sensor dies, or power dies. Various types of die that may be embedded into substrate 106 are further discussed below in FIG. 1D. It is further contemplated herein that through cavity 108*c* and TSVs 110, may be etched (e.g., formed) at any step disclosed in process 100, such as the step of etching a second dielectric layer or a metal layer disclosed below in step 130 of FIG. 1F.

In some embodiments, cavities are etched using deep reactive ion etching (DRIE). In other embodiments, cavities are patterned using reactive ion etching (RIE), plasma etching, wet etching, laser etching, laser drilling, ion beam etching, non-reactive dry etching, anisotropic etching, atomic layer etching, mechanical milling, or any other patterning technique now known or later developed. In some embodiments, a photolithography process is used to etch cavities into surface 104 of substrate 106. For example, the photolithography process may include any or all of the following steps: (1) applying a surface treatment material to surface 104, such as HMDS (Hexamethyldisilazane), (2) applying a photoresist material to surface 104, such as Shipley 1827, to form a photoresist layer, (3) exposing surface 104, via a photoresist mask, to UV (ultraviolet) light, (4) developing substrate 106 by immersing it into a developer solution for revealing a desired photoresist pattern onto surface 104, (5) inspecting the photoresist pattern for any defects and to ensure that it meets the desired photoresist pattern specifications, (6) etching, via DRIE or other patterning technique previously mentioned, cavities into the surface(s) of the substrate based on the desired photoresist pattern, where any number of alternating steps of patterning and passivation may be used to achieve a desired cavity size, (7) stripping (e.g., removing) the remaining photoresist layer from the surface using a solvent or photoresist stripper, and (8) doing an additional inspection to confirm that the cavities have been patterned to a desired depth and that the desired photoresist pattern has been maintained.

In some embodiments, cavities may have any length, width, or depth. For instance, first cavity 108*a* may have a width of approximately 1500 micrometers (μm), a length of approximately 1500 μm, and a depth of approximately 1400 μm, while second cavity 108*b* may similarly have a width of approximately 1500 μm, a length of approximately 1500 μm, and a depth of approximately 1300 μm. Cavities may be shallow trenches, deep trenches, or high-aspect-ratio holes. For example, the sizing, spacing, and/or pattern of cavities may be predetermined to accommodate subsequent processing steps of process 100. For instance, cavities may be etched using a photolithography process or other patterning techniques (as previously discussed) to define the specific areas of substrate 106 that will be etched. By etching the cavities in a precise pattern, substrate 106 may be tailored to align with the next steps of process 100, such as the integration of microelectromechanical systems (MEMS), the formation of TSVs 110, or the embedding of semiconductor dies into substrate 106. For example, the cavity pattern may be designed to ensure that each etched feature of substrate 106 supports the necessary electrical, mechanical, or thermal connections that will be established in the later processing steps of process 100.

Figure 1B:
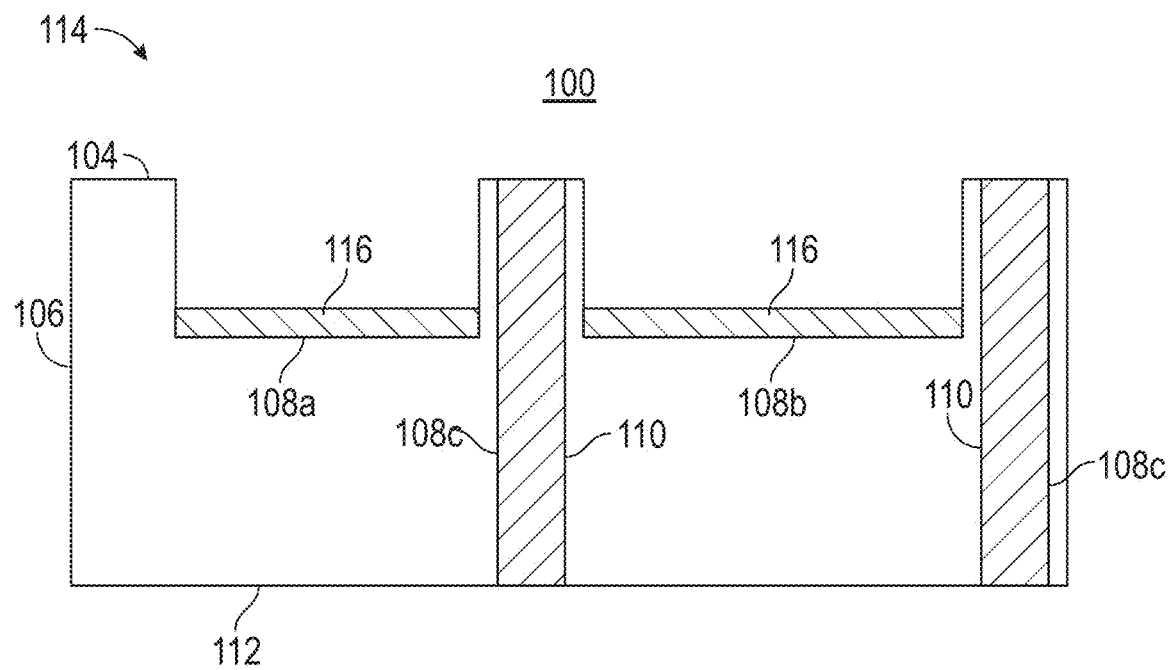
FIG. 1B illustrates an exemplary step of applying a first dielectric layer during a method for fabricating a semiconductor wafer.

FIG. 1B illustrates another exemplary step of process 100. Process 100 may include step 114, where a first dielectric layer may be applied to the surface of substrate and some or all cavities. For example, first dielectric layer 116 may be applied to surface 104 of substrate 106, first cavity 108*a*, and second cavity 108*b*. First dielectric layer 116 may be applied using chemical vapor deposition, physical vapor deposition, atomic layer deposition, spin coating, or any now-known or later-developed deposition technique.

In some embodiments, first dielectric layer 116 is an inorganic dielectric material. For example, first dielectric layer 116 may be plasma-enhanced tetraethyl orthosilicate (PETEOS), thermal oxide, silicon nitride, aluminum oxide, aluminum nitride, silicon carbide, gallium oxide, hafnium oxide, or titanium dioxide. In other embodiments, first dielectric layer 116 is an organic dielectric material. For example, first dielectric layer 116 may be polyimide, benzocyclobutene (BCB), epoxy resin, polyethylene (PE), polypropylene (PP), polystyrene (PS), or polyvinyl chloride (PVC).

In some embodiments, first dielectric layer 116 is applied to surface 104, first cavity 108*a*, and second cavity 108*b* such that first dielectric layer 116 completely covers the surface and/or cavities. In other embodiments, first dielectric layer 116 is applied to surface 104, first cavity 108*a*, and second cavity 108*b* such that first dielectric layer only partially covers the surface and/or cavities. In some embodiments, first dielectric layer 116 applied to first cavity 108*a* may be the same or a different dielectric material than first dielectric layer 116 applied to second cavity 108*b* and/or surface 104. In some embodiments, the first dielectric layer may be applied to the sidewalls and/or bottom surface of cavities.

Figure 1C:
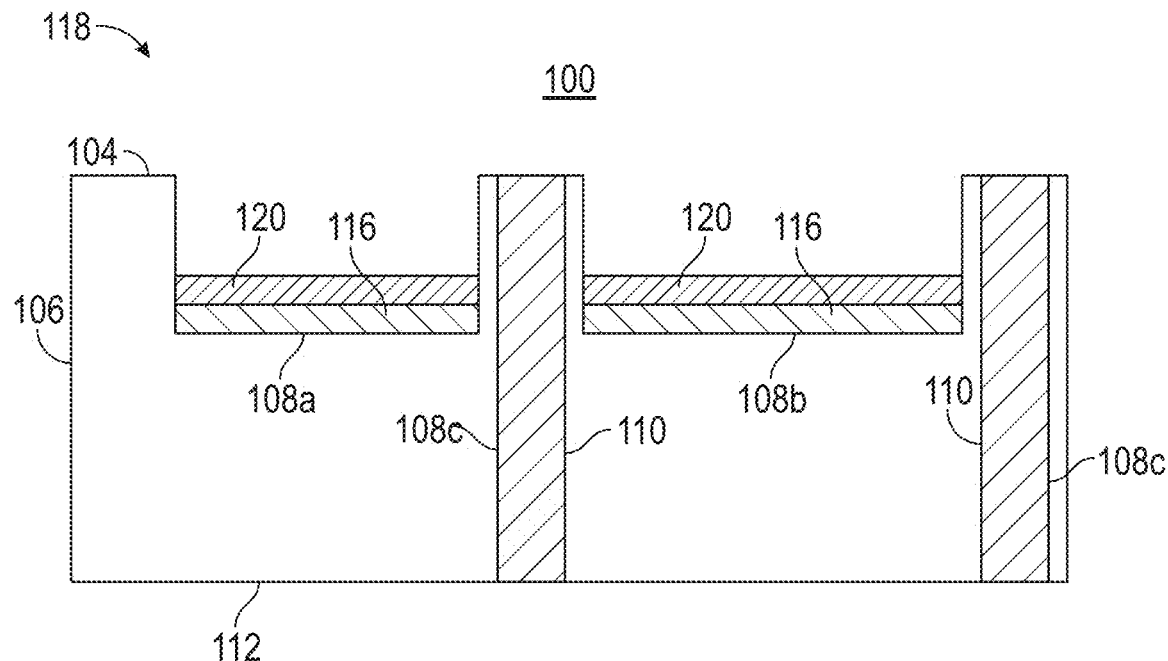
FIG. 1C illustrates an exemplary step of applying an adhesive layer during a method for fabricating a semiconductor wafer.

FIG. 1C illustrates an exemplary step of process 100. Process 100 may include step 118, where an adhesive layer 120 may be applied to substrate 106. For example, adhesive layer 120 may be applied to surface 104, first cavity 108*a*, or second cavity 108*b*. For instance, adhesive layer 120 may be applied to surface 104, first cavity 108*a*, and second cavity 108*b* such that adhesive layer 120 completely covers surface 104, first cavity 108*a*, and second cavity 108*b* or only partially covers surface 104, first cavity 108*a*, and second cavity 108b. In some embodiments, the adhesive layer may be applied to the sidewalls and/or bottom surface of the cavities.

In some embodiments, adhesive layer 120 is applied to at least a portion of first dielectric layer 116, in which first dielectric layer 116 has already been applied to surface 104, first cavity 108a, and/or second cavity 108b. Different types of adhesives may be applied to different parts of substrate 106. For example, a first type of adhesive layer 120 may be applied to first cavity 108a while a distinct second, type of adhesive layer 120 may be applied to second cavity 108b. For instance, depending on what type of component (e.g., die) may be affixed to the cavities, a first type of adhesive layer 120 may adhere better to a first type of component being affixed to first cavity 108a, while a second type of adhesive layer 120 may adhere better to a second type of component being affixed to second cavity 108b.

Adhesive layer 120 may be an inter-via adhesive, polyimide adhesive, epoxy adhesive, silicone adhesive, acrylic adhesive, thermoplastic adhesive, or any now-known or later-developed adhesive for adhering a component (e.g., dies) to a substrate. Adhesive layer 120 may be applied to substrate 106 by brushing, rolling, spraying, dip coating, spin coating, screen printing, or any now-known or later-developed technique for applying an adhesive layer 120 to substrate 106.

Figure 1D:
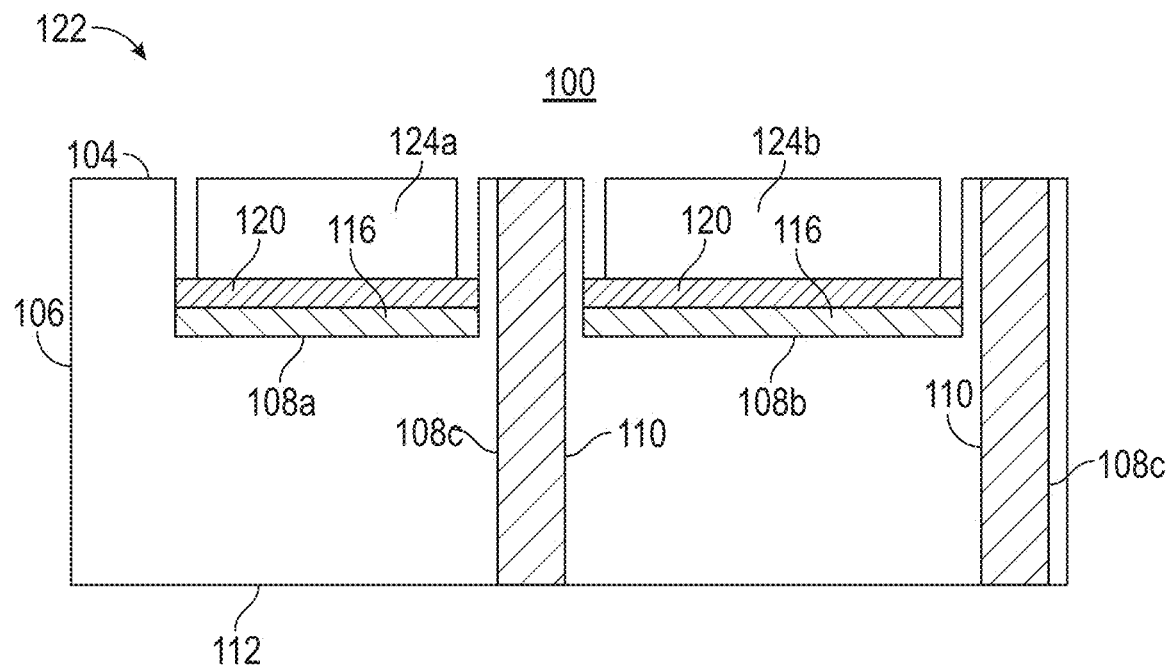
FIG. 1D illustrates an exemplary step of affixing dies to etched cavities of a substrate during a method for fabricating a semiconductor wafer.

FIG. 1D illustrates an exemplary step of process 100. Process 100 includes step 122, where one or more dies such as first die 124a and second die 124b may be affixed (e.g., embedded, attached, adhered, or coupled) to first cavity 108a and second cavity 108b, respectively. For example, a first die 124a may be affixed to first cavity 108a, and second die 124b may be affixed to second cavity 108b. First die 124a and second die 124b may be affixed to first cavity 108a and second cavity 108b, respectively, using adhesive layer 120. For example, first die 124a may be affixed to first cavity 108a using a first type of adhesive layer 120, and second die 124b may be affixed to second cavity 108b using a second type of adhesive layer 120. In some embodiments, adhesive layer 120 is first applied to the surface of the dies before the dies are placed into the cavities for affixation. First die 124a and second die 124b may be permanently or temporarily affixed to first cavity 108a and second cavity 108b. In some embodiments, first die 124a and second die 124b may be affixed to first cavity 108a and second cavity 108b at different processing steps. For example, first die 124a may be directly fabricated onto substrate 106 during step 122, while leaving one or more vacant cavities. At a later time, one or more additional dies (e.g., an instance of second die 124b that is fabricated on a different semiconductor wafer) may be affixed into the one or more vacant cavities, allowing flexibility in the fabrication process of the semiconductor wafer.

First die 124a and second die 124b may be any type of semiconductor die. For example, first die 124a and second die 124b may each be a functional die such as operational amplifier dies, voltage regulator dies, analog-to-digital converter dies, digital-to-analog converter dies, memory dies (e.g., DRAM dies or SRAM dies), logic processor dies (e.g., MPU dies or ASIC dies), digital signal processor dies, system-on-chip dies, sensor dies, or power dies. In another example, first die 124a and second die 124b may be dies comprised of a certain material. For instance, first die 124a and second die 124b may be silicon dies, gallium arsenide (GaAs) dies, gallium nitride (GaN) dies, silicon carbide (SiC) dies, or any other now known or later developed semiconductor die. Advantageously, process 100 further allows integration of dies that cannot be flip-chip bonded, such as radio frequency (RF) dies with air bridges.

In some embodiments, first die 124a and second die 124b may be a single type of die. For example, first die 124a affixed to first cavity 108a may be the same type (e.g., same material or same function) as second die 124b affixed to second cavity 108b. For instance, first die 124a and second die 124b may both be silicon carbide dies or operational amplifier dies. In other embodiments, First die 124a and second die 124b may be distinct (e.g., heterogeneous). For example, first die 124a affixed may be distinct (e.g., different material or different function) from second die 124b. For instance, first die 124a may be a silicon die while second die 124b may be a gallium arsenide die. In another example, first die 124a may be an operational amplifier die while second die 124b may be a memory die. In some embodiments, components other than dies (e.g., active components) may be affixed into the cavities. For example, one or more passive components, such as heat sinks, resistors, capacitors, inductors, or diodes may be affixed to cavities.

Dies may be any shape or size in accordance with embodiments of the current disclosure. In some embodiments, first cavity 108a and second cavity 108b, formed in step 102, may be formed based on the size of first die 124a and second die 124 being affixed to first cavity 108a and second cavity 108b in step 122. In some embodiments, cavities may be formed such that one or more gaps are formed between cavities and the dies to be inserted. For example, first cavity 108a may be formed such that there is a 10 µm gap between one or more sidewalls of first die 124a and one or more sidewalls of first cavity 108a upon affixing first die 124a to first cavity 108a. In other embodiments, cavities may be formed such that no gaps are formed between the cavity and the respective die.

In some embodiments, dies may be affixed to cavities by anodic bonding. For example, rather than using adhesive layer 120 to affix first die 124a and second die 124b to first cavity 108a and second cavity 108b, anodic bonding may be used. For instance, through the application of heating the substrate 106 and applying a voltage across substrate 106, dies may be anodically bonded (e.g., affixed) to cavities via an electrostatic bond between the respective interfaces of the dies and the cavities. In some embodiments, first die 124a may be affixed to first cavity 108a using adhesive layer 120, while second die 124b is affixed to second cavity 108b using anodic bonding.

Figure 1E:
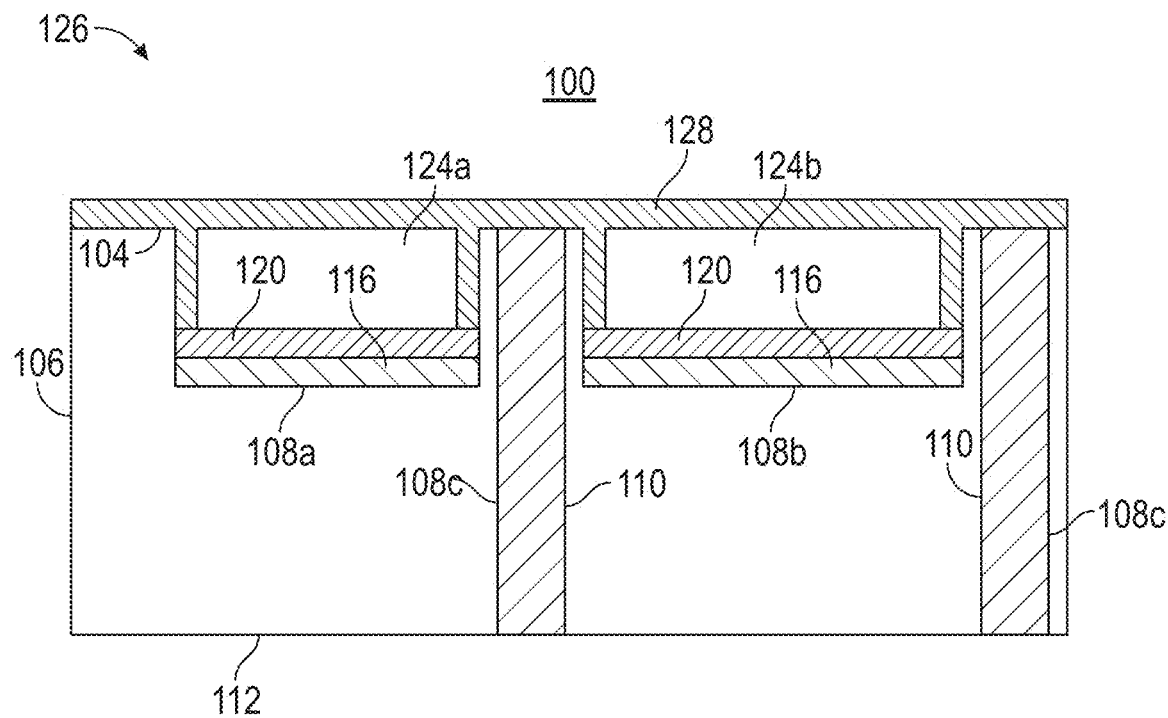
FIG. 1E illustrates an exemplary step of applying a second dielectric layer during a method for fabricating a semiconductor wafer.

FIG. 1E illustrates an exemplary step of process 100. Process 100 includes step 126, where a second dielectric layer 128 may be applied to the surface and dies. For example, second dielectric layer 128 may be applied to surface 104, an exposed surface (e.g., a top surface or side surface) of first die 124a, and/or an exposed surface of second die 124b. In some embodiments, second dielectric layer 128 is applied such that the second dielectric layer fills any gaps between dies and cavities. For example, second dielectric layer 128 may fill one or more gaps between first die 124a and first cavity 108a such that one or more sides of first die 124a are partially or completely covered by second dielectric layer 128. Second dielectric layer 128 may be applied to substrate 106 using chemical vapor deposition, physical vapor deposition, atomic layer deposition, spin coating, or any now known or later developed deposition technique.

In some embodiments, second dielectric layer 128 is an inorganic dielectric material. For example, second dielectric layer 128 may be plasma-enhanced tetraethyl orthosilicate (PETEOS), thermal oxide, or silicon nitride. In other embodiments, second dielectric layer 128 is an organic dielectric material such as polyimide. Second dielectric layer 128 may be any type of dielectric material referenced above in FIG. 1B with respect to first dielectric layer 116. In some embodiments, first dielectric layer 116 and second dielectric layer 128 comprise the same type of dielectric material. In other embodiments, first dielectric layer 116 and second dielectric layer 128 each comprise a different type of dielectric material, In some embodiments, second dielectric layer 128 is applied to the surface and the dies that second dielectric layer 128 completely covers the surface and/or dies or only partially covers the surface and/or dies. In some embodiments, second dielectric layer 128 applied to first die 124a may be the same or a different dielectric material than second dielectric layer 128 applied to second die 124b and/or surface 104.

Figure 1F:
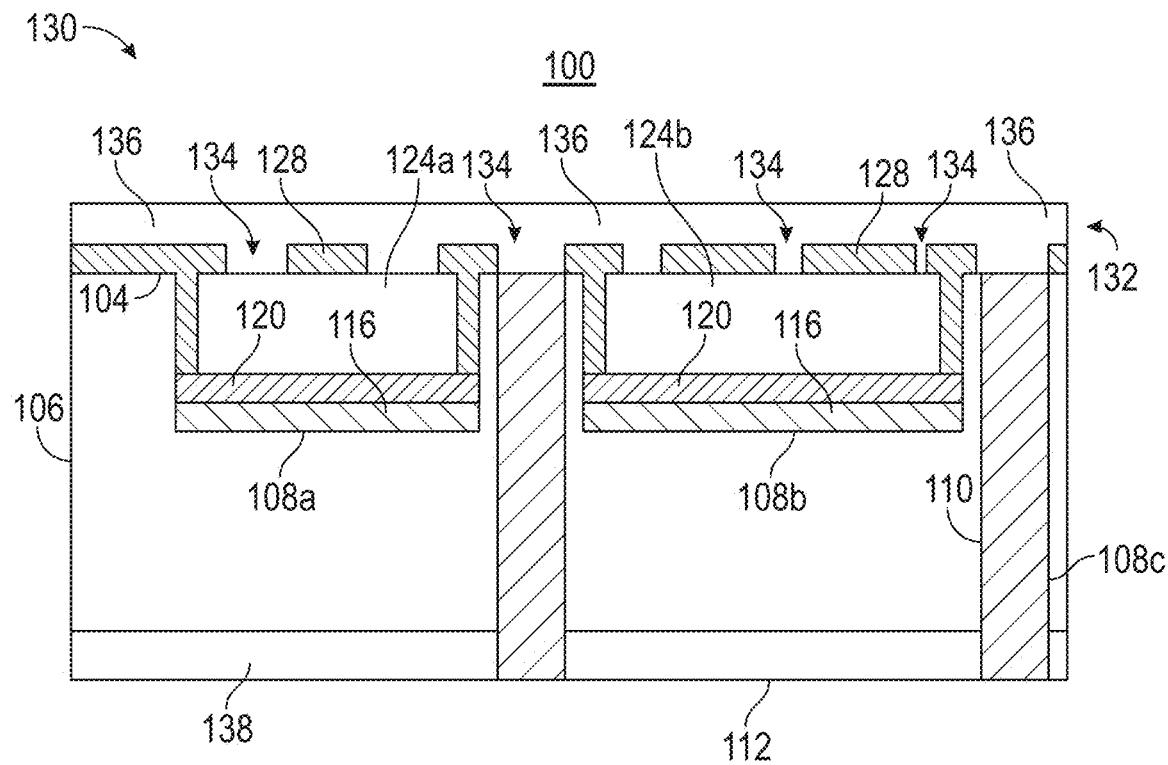
FIG. 1F illustrates an exemplary step of forming a redistribution layer during a method for fabricating a semiconductor wafer.

FIG. 1F illustrates an exemplary step of process 100. Process 100 includes step 130, where a redistribution layer 132 may be formed over second dielectric layer 128 such that different dies may be electrically coupled. Redistribution layer 132 may include one or more components and/or layers for electrically coupling one or more dies (such as first die 124a and second die 124b). For example, redistribution layer 132 may include one or more instances of openings 134 (e.g., vias) and a metal layer 136. Step 130 of forming the redistribution layer 132 may include one or more additional steps such as forming the openings 134 and patterning metal layer 136 to form a desired metal pattern for electrically coupling different dies (such as first die 124a and second die 124b). Redistribution layer 132 may further include circuitry, vias, or metal interconnects (e.g., wires) for electrically coupling different dies.

In some embodiments, step 130 includes forming the openings 134. Openings 134 may be formed in second dielectric layer 128. For example, openings 134 may be formed in second dielectric layer 128 such that dies and/or cavities may be exposed. For instance, openings 134 may be formed in second dielectric layer 128 such that a surface of first die 124a, second die 124b, and/or TSVs 110 may be exposed for subsequent contact to metal layer 136. In some embodiments, openings 134 may be vias filled with a conductive material, such as copper, for electrically coupling different die contacts via metal layer 136.

In some embodiments, openings 134 are formed using DRIE. In other embodiments, openings 134 are formed using RIE, plasma etching, wet etching, laser etching, laser drilling, ion beam etching, non-reactive dry etching, anisotropic etching, atomic layer etching, mechanical milling, or any other patterning technique now known or later developed. In some embodiments, openings 134 are formed in second dielectric layer 128 via a photolithography process. For example, the photolithography process may include any or all of the following steps: (1) applying a surface treatment material to second dielectric layer 128 to remove any contaminants, (2) applying a photoresist material to second dielectric layer 128, to form a photoresist layer, (3) exposing at least a portion of second dielectric layer 128, via a photoresist mask, to UV light, (4) developing second dielectric layer 128 by immersing the substrate 106 into a developer solution for revealing a desired photoresist pattern onto second dielectric layer 128, (5) inspecting the photoresist pattern for any defects and to ensure that it meets the desired photoresist pattern specifications, (6) etching, via DRIE or other patterning technique previously mentioned, the openings 134 into second dielectric layer 128 based on the desired photoresist pattern, where any number of alternating steps of patterning and passivation may be used to achieve a desired size of openings 134, (7) stripping (e.g., removing) the remaining photoresist layer from second dielectric layer 128 using a solvent or photoresist stripper, and (8) doing an additional inspection to confirm that openings 134 have been patterned to a desired depth and that the desired photoresist pattern has been maintained to form a desired dielectric pattern. The desired dielectric pattern may be patterned based on the wiring paths and circuitry needed to electrically couple components of the semiconductor wafer, as discussed below.

In some embodiments, upon forming the desired dielectric pattern with openings 134, redistribution layer 132 is formed over second dielectric layer 128 by applying a metal layer 136 to second dielectric layer 128 and openings 134 such that dies (such as first die 124a and second die 124b) are electrically coupled to each other or other components via TSVs 110. For example, metal layer 136 may comprise a metal material that partially or completely covers the exposed surface of substrate 106 when metal layer 136 is applied. For instance, the metal material may cover any remaining portions of second dielectric layer 128 and fill openings 134 with the metal material such that underlying components or layers contact the metal material. Metal layer 136 may be applied using chemical vapor deposition, physical vapor deposition, atomic layer deposition, or any now-known or later-developed deposition technique. The metal material of metal layer 136 may comprise a conductive material such as copper, aluminum, gold, silver, nickel, tin, or any other conductive material. For example, metal layer 136 may contain circuitry and wiring to electrically couple the first die 124a and second die 124b. Redistribution layer 132 may further include passive components, such as resistors or capacitors, to facilitate the energy distribution between dies and/or TSVs.

Upon applying metal layer 136 to second dielectric layer 128 and openings 134, metal layer 136 may be patterned to form a desired metal pattern configured for electrically coupling dies to each other or other components via TSVs 110. In some embodiments, patterning metal layer 136 to form the desired metal pattern may be achieved via a photolithography process. For example, the photolithography process for patterning metal layer 136 may include any or all of the following steps: (1) applying a surface treatment material to metal layer 136 to remove any contaminants, (2) applying a photoresist material to metal layer 136, to form a photoresist layer, (3) exposing at least a portion of the photoresist layer, via a photoresist mask, to UV light, (4) developing metal layer 136 by immersing the substrate 106 into a developer solution for revealing a desired photoresist pattern onto metal layer 136, (5) inspecting the photoresist pattern for any defects and to ensure that it meets the desired photoresist pattern specifications, (6) etching, via DRIE or other patterning technique previously mentioned, at least a portion of metal layer 136 based on the desired photoresist pattern, where any number of alternating steps of patterning and passivation may be used to achieve a desired metal pattern, (7) stripping (e.g., removing) the remaining photoresist layer from metal layer 136 using a solvent or photoresist stripper, and (8) doing an additional inspection to confirm that metal layer 136 has been patterned such that the desired photoresist pattern has been maintained to form the desired metal pattern.

Upon forming the redistribution layer 132 over second dielectric layer 128, as discussed above, dies may be intercoupled (e.g., electrically or thermally) or coupled to other components 138. For example, redistribution layer 132 may electrically couple one or more contact pads (e.g., electrical contact pads) of first die 124a to one or more contact pads of second die 124b. In another example, contact pads of first die 124a may be coupled to one or more instances of TSVs 110 via redistribution layer 132. For instance, redistribution layer 132 may couple first die 124a to other components 138, such as a heat sink or additional dies. TSVs 110 advantageously allow for the semiconductor wafer formed from process 100 to have backside contacting capabilities. For example, TSVs 110 may couple dies to one or more other instances of other components 138 such as diodes, MOSFETs, VDMOSFETs, power amps (e.g., a power amp soldered to a Cu brick and embedded within or coupled to substrate 106), passive components, additional dies, external semiconductor wafers, or electrical interface points of a semiconductor package.

In some embodiments, upon forming the redistribution layer 132 over second dielectric layer 128, a semiconductor wafer fabricated by process 100 may be formed. The fabricated semiconductor wafer may contain any or all the features and aspects described above in FIGS. 1A-1F. The semiconductor wafer fabricated by process 100 is further discussed below in FIG. 2.

FIG. 1G illustrates a top-down cross-sectional view of forming the redistribution layer 132 during step 130 of process 100. As discussed above, dies may be electrically coupled via redistribution layer 132. For example, first die 124a and second die 124b may be electrically coupled by one or more metal interconnects 140 (e.g., wire bonds, copper interconnects, or aluminum interconnects). For instance, metal layer 136 may be patterned in a desired pattern such that one or more contact pads 142 of first die 124a are electrically coupled to one or more contact pads of second die 124b via one or more metal interconnects 140. Any number of dies may be electrically coupled to each other or other components. For example, a third die located in a third cavity may be electrically coupled to first die 124a and/or second die 124b via one or more metal interconnects 140. In some embodiments, contact pads of dies may be electrically coupled to additional dies. For example, first die 124a may be electrically coupled to additional dies located on additional semiconductor wafers. In some embodiments, additional semiconductor wafers are electrically and/or mechanically coupled to the semiconductor wafer fabricated by process 100 such that a vertically stacked (3D integration) semiconductor structure is formed with a plurality of stacked semiconductor wafers. In other embodiments, the additional dies may be laterally disposed (2.5D integration) from the semiconductor wafer fabricated by process 100 such that an interposer electrically couples first die 124a to additional dies or components of another semiconductor structure.

Figure 2:
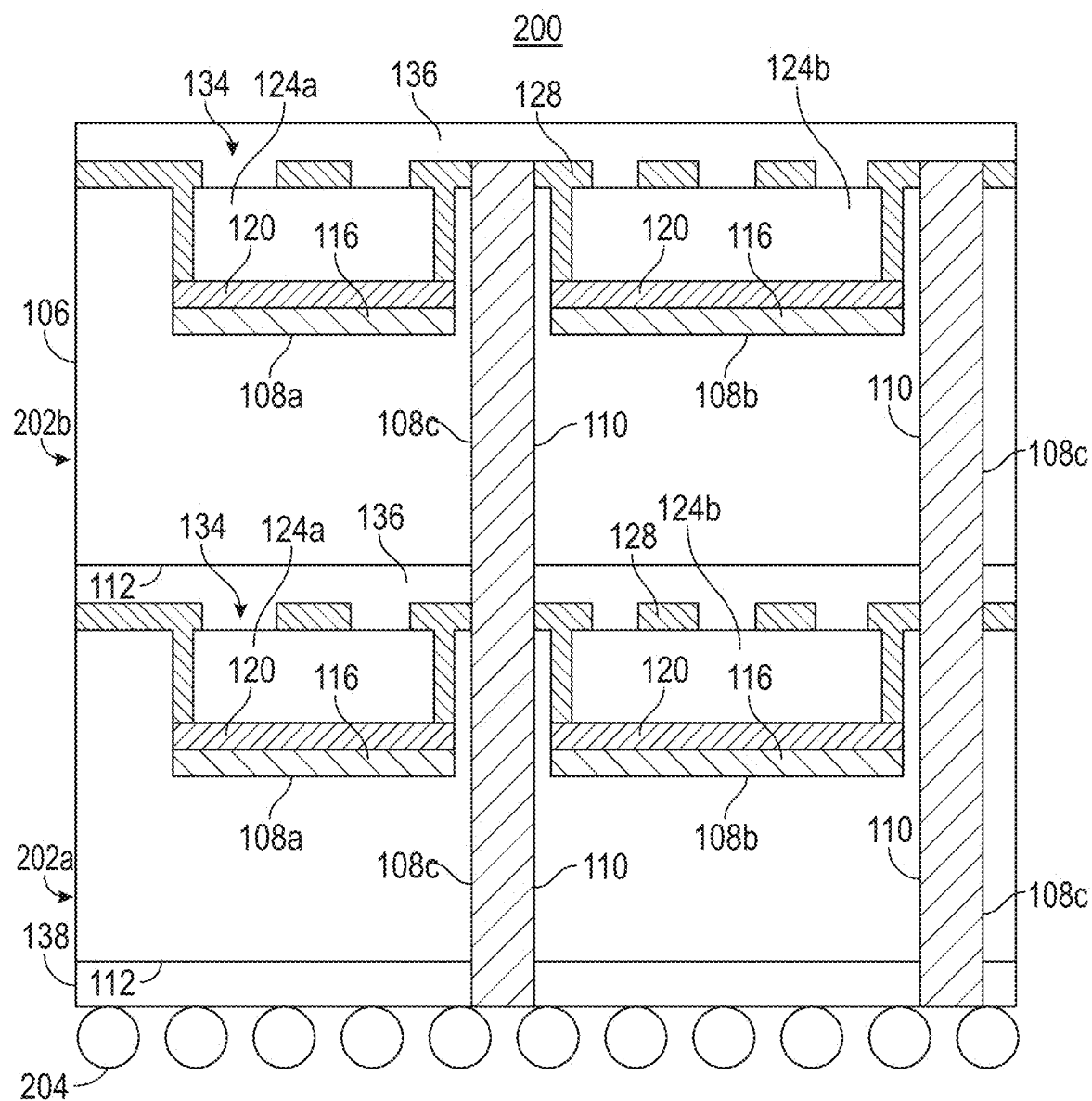
FIG. 2 illustrates an exemplary embodiment of a semiconductor structure including one or more semiconductor wafers.

FIG. 2 illustrates an exemplary embodiment of a semiconductor structure 200 including one or more semiconductor wafers. Semiconductor wafers may be fabricated using process 100 and comprise any or all the features and aspects disclosed above in FIGS. 1A-1G. In some embodiments, semiconductor structure 200 includes a single of semiconductor wafer. In some embodiments, semiconductor structure 200 includes a first semiconductor wafer 202a and a second semiconductor wafer 202b vertically stacked to form a stacked semiconductor structure. In some embodiments, first semiconductor wafer 202a and second semiconductor wafer 202b are fabricated using process 100. In some embodiments, the stacked semiconductor structure is configured such that only one of first semiconductor wafer 202a and second semiconductor wafer 202b is fabricated using process 100. For example, first semiconductor wafer 202a may include one or more dies (such as first die 124a and second die 124b) affixed to one or more cavities (such as first cavity 108a and second cavity 108b) etched into a surface of a silicon substrate, as discussed above with reference to process 100. In the same example, second semiconductor wafer 202b may be a semiconductor wafer 202 fabricated by a different fabrication process than process 100, where cavities are not present. A stacked semiconductor structure may include any number of semiconductor wafers vertically stacked and electrically coupled.

In some embodiments, semiconductor wafers 202 of a stacked semiconductor structure instance of semiconductor structure 200 are electrically coupled by TSVs 110. For example, semiconductor wafers may each include TSVs such that the TSVs act as vertical interconnects for electrically coupling two or more semiconductor wafers of the stacked semiconductor structure. TSVs may be filled with conductive material, such as copper or tungsten, to create electrical interconnects between dies (such as first die 124a and second die 124b) or other components of the two or more semiconductor wafers. Additionally, TSVs may be insulated from the substrate using dielectric material.

In some embodiments, TSVs 110 of semiconductor structure 200 are partial TSVs, where a backside 112 of a semiconductor wafer may be thinned down (via a thinning step) to expose a partial TSV instance of TSVs 110 to electrically or thermally couple the semiconductor wafer to other components 138 or a second semiconductor wafer 202b. For example, TSVs 110 may thermally couple semiconductor wafer 202 to other components 138, such as a heat sink. In some embodiments, the semiconductor wafers of a stacked semiconductor structure are electrically and/or mechanically coupled via a bonding adhesive or via solder bumps 204.

In some embodiments, semiconductor structure 200 is encapsulated with a protective material, such as epoxy or resin, to enhance the durability of semiconductor structure 200 and protect the electrical connections and components from environmental factors. In some embodiments, semiconductor structure 200 is coupled to an external packaging module such as a printed circuit board (PCB). For example, semiconductor structure 200 may be coupled to the external packaging module via wire bonding, solder bumps 204, or vias. Semiconductor structure 200 may also be electrically coupled to the external packaging module or additional semiconductor wafers via flip-chip bonding.

Figure 3:
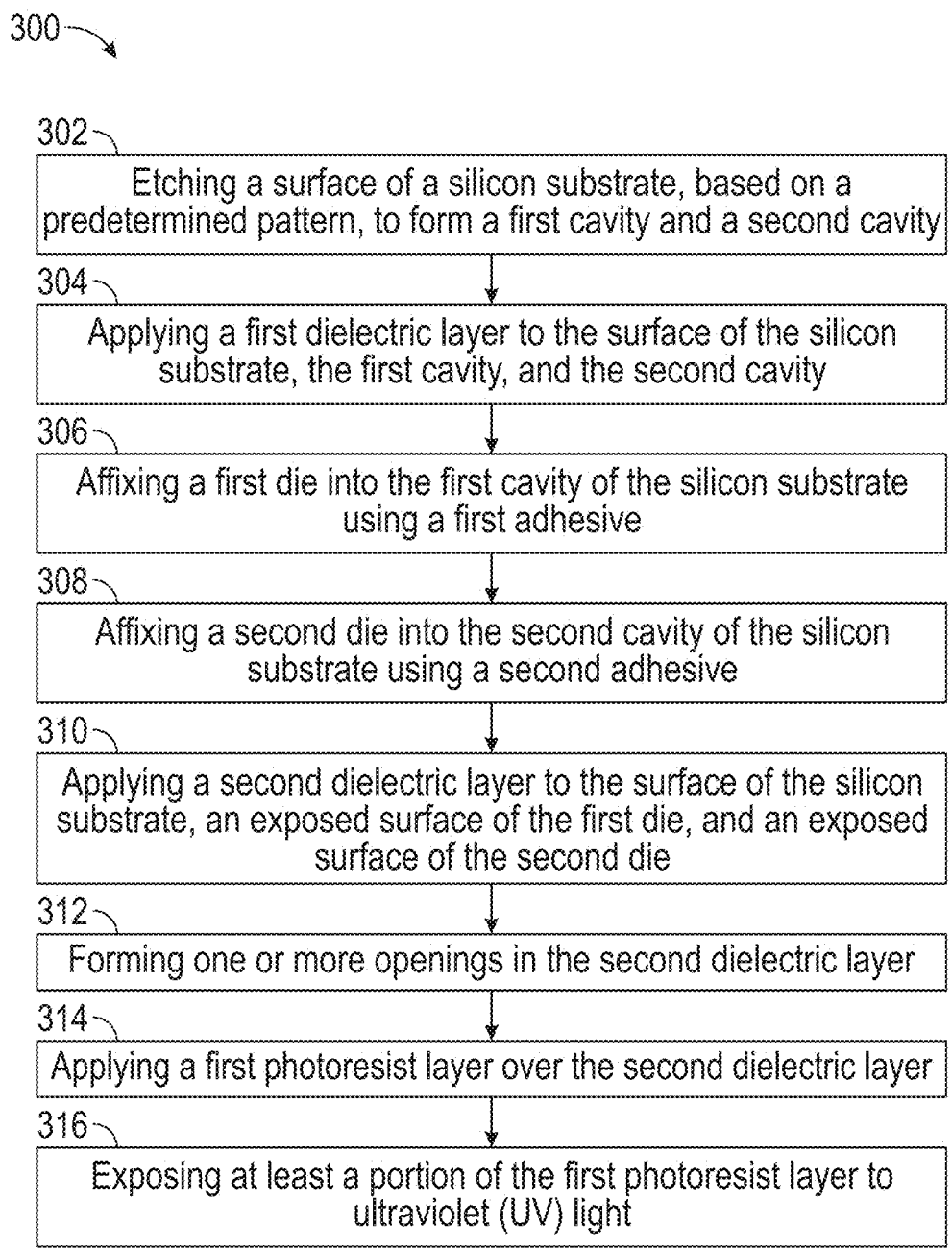
FIGS. 3-3A illustrate an exemplary method for fabricating a semiconductor wafer.
Figure 3A:
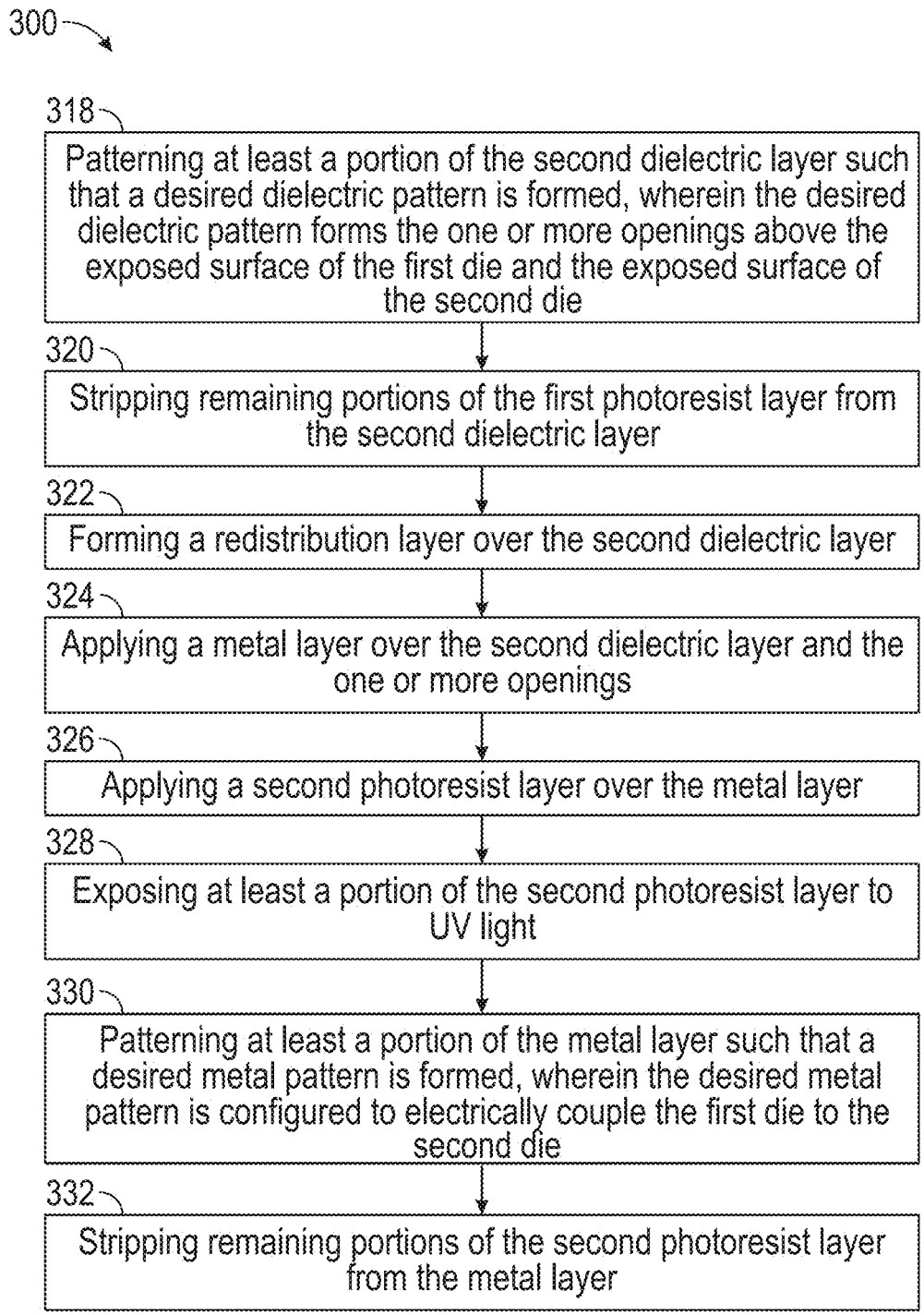

FIG. 3 and FIG. 3A illustrate an exemplary method for fabricating a semiconductor wafer generally referred to as method 300. Method 300 may, but is not limited to, include all the aspects and features of process 100 disclosed above in FIGS. 1A-1G. At step 302, a surface of a silicon substrate, based on a predetermined pattern, may be etched to form a first cavity and a second cavity. Any number of cavities may be etched into the surface of the silicon substrate. In some embodiments, the surface is etched using DRIE. In some embodiments, the substrate is comprised of a material other than silicon, such as aluminum oxide or aluminum nitride.

At step 304, a first dielectric layer may be applied to the surface of the silicon substrate, the first cavity, and the second cavity. In some embodiments, the first dielectric material is an inorganic dielectric material such as tetraethyl orthosilicate (PETEOS), thermal oxide, or silicon nitride. In other embodiments, the first dielectric layer is an organic dielectric material such as a polyimide.

At step 306, a first die may be affixed into the first cavity of the silicon substrate using a first adhesive. At step 308, a second die may be affixed into the second cavity of the silicon substrate using a second adhesive. In some embodiments, the second adhesive may be the same or a different dielectric material than the first adhesive. In some embodiments, the adhesive is an intervia or polyimide adhesive. In some embodiments, the first die or the second die may be a functional die such as operational amplifier dies, voltage regulator dies, analog-to-digital converter dies, digital-to-analog converter dies, memory dies (e.g., DRAM dies or SRAM dies), logic processor dies (e.g., MPU dies or ASIC dies), digital signal processor dies, system-on-chip dies, sensor dies, or power dies. In other embodiments, the first die or the second die may be a die comprised of a certain material such as silicon dies, gallium arsenide (GaAs) dies, gallium nitride (GaN) dies, silicon carbide (SiC) dies, silicon germanium (SiGe) dies, or any other now-known or later-developed semiconductor die.

At step 310, a second dielectric layer may be applied to the surface of the silicon substrate, an exposed surface of the first die, and an exposed surface of the second die. In some embodiments, the second dielectric layer may be the same type of dielectric material as the first dielectric layer. In other embodiments, the second dielectric layer may be a distinct type of dielectric material as the first dielectric layer.

At step 312, one or more openings may be formed in the second dielectric layer. In some embodiments, the openings may be formed using a photolithography process. For example, at step 314, a first photoresist layer may be applied over the second dielectric layer. At step 316, at least a portion of the first photoresist layer may be exposed to UV light. At step 318, at least a portion of the second dielectric layer may be patterned such that a desired dielectric pattern is formed, where the desired dielectric pattern forms the openings above the exposed surface of the first die and the exposed surface of the second die. At step 316, the remaining portions of the first photoresist layer may be stripped from the second dielectric layer.

At step 322, a redistribution layer may be formed over the second dielectric layer. The redistribution layer may electrically couple the first die to the second die. Step 322 may generally include step 324 through step 332 below. At step 324, a metal layer may be applied over the second dielectric layer and the openings. In some embodiments, the metal layer is applied in a desired metal pattern by using a photolithography process. For example, at step 326, a second photoresist layer may be applied over the metal layer. At step 328, at least a portion of the second photoresist layer may be exposed to UV light. At step 330, at least a portion of the metal layer may be patterned such that a desired metal pattern is formed, where the desired metal pattern is configured to electrically couple the first die to the second die. Process 100 ends at step 332, where the remaining portions of the second photoresist layer may be stripped from the metal layer.

The following embodiments represent exemplary embodiments of concepts contemplated herein. Any one of the following embodiments may be combined in a multiple-dependent manner to depend from one or more other clauses. Further, any combination of dependent embodiments (e.g., clauses that explicitly depend from a previous clause) may be combined while staying within the scope of aspects contemplated herein. The following clauses are exemplary in nature and are not limiting.

Clause 1. A method for fabricating a semiconductor wafer via substrate embedment, the method comprising: etching a surface of a silicon substrate, based on a predetermined pattern, to form a first cavity and a second cavity; applying a first dielectric layer to the surface of the silicon substrate, the first cavity, and the second cavity; affixing a first die into the first cavity of the silicon substrate using a first adhesive; affixing a second die into the second cavity of the silicon substrate using a second adhesive; applying a second dielectric layer to the surface of the silicon substrate, an exposed surface of the first die, and an exposed surface of the second die; forming one or more openings in the second dielectric layer by: applying a first photoresist layer over the second dielectric layer; exposing at least a portion of the first photoresist layer to ultraviolet (UV) light; patterning at least a portion of the second dielectric layer such that a desired dielectric pattern is formed, wherein the desired dielectric pattern forms the one or more openings above the exposed surface of the first die and the exposed surface of the second die; and stripping remaining portions of the first photoresist layer from the second dielectric layer; and forming a redistribution layer over the second dielectric layer by: applying a metal layer over the second dielectric layer and the one or more openings; applying a second photoresist layer over the metal layer; exposing at least a portion of the second photoresist layer to UV light; patterning at least a portion of the metal layer such that a desired metal pattern is formed, wherein the desired metal pattern is configured to electrically couple the first die to the second die; and stripping remaining portions of the second photoresist layer from the metal layer.

Clause 2. The method of clause 1, wherein the first die is distinct from the second die.

Clause 3. The method of clause 1 or 2, wherein the first die is a gallium arsenide die.

Clause 4. The method of any of clauses 1 through 3, wherein the surface of the silicon substrate is etched by deep reactive ion etching.

Clause 5. The method of any of clauses 1 through 4, wherein the first dielectric layer is formed of thermal oxide.

Clause 6. The method of any of clauses 1 through 5, wherein the second dielectric layer is formed of an inorganic dielectric material.

Clause 7. The method of any of clauses 1 through 6, wherein the redistribution layer couples the first die to the second die via electrically coupling a first contact pad of the first die to a second contact pad of the second die.

Clause 8. A method for fabricating a semiconductor wafer via substrate embedment, the method comprising: etching a surface of a silicon substrate to form a first cavity and a second cavity; affixing a first die into the first cavity of the silicon substrate; affixing a second die into the second cavity of the silicon substrate, wherein the first die is distinct from the second die; applying a dielectric layer to the surface of the silicon substrate, an exposed surface of the first die, and an exposed surface of the second die, wherein the dielectric layer is an inorganic dielectric material; forming one or more openings in the dielectric layer by: applying a first photoresist layer over the dielectric layer; exposing at least a portion of the first photoresist layer to ultraviolet (UV) light; patterning at least a portion of the dielectric layer such that a desired dielectric pattern is formed, wherein the desired dielectric pattern forms the one or more openings above the exposed surface of the first die and the exposed surface of the second die; and stripping remaining portions of the first photoresist layer from the dielectric layer; and forming a redistribution layer over the dielectric layer by: applying a metal layer over the dielectric layer and the one or more openings; applying a second photoresist layer over the metal layer; exposing at least a portion of the second photoresist layer to UV light; patterning at least a portion of the metal layer such that a desired metal pattern is formed, wherein the desired metal pattern is configured to electrically couple the first die to the second die; and stripping remaining portions of the second photoresist layer from the metal layer.

Clause 9. The method of clause 8, wherein the inorganic dielectric material is plasma enhanced tetraethyl orthosilicate (PETEOS).

Clause 10. The method of clause 8 or 9, wherein the first die is a silicon carbide die.

Clause 11. The method of any of clauses 8 through 10, further comprising: etching the surface of the silicon substrate to form a third cavity; affixing a third die into the third cavity of the silicon substrate; applying the dielectric layer to an exposed surface of the third die; forming additional one or more openings in the dielectric layer applied to the exposed surface of the third die; and electrically coupling, via the redistribution layer, the third die to at least the first die or the second die.

Clause 12. The method of any of clauses 8 through 11, further comprising: etching the surface of the silicon substrate to form a third cavity, wherein the third cavity extends at least partially through the silicon substrate to form a through-silicon via (TSV).

Clause 13. The method of any of clauses 8 through 12, wherein the first die is thermally coupled to a heat sink via the TSV.

Clause 14. The method of any of clauses 8 through 13, wherein the first die is affixed to the first cavity by anodic bonding.

Clause 15. A semiconductor wafer, comprising: a silicon substrate; a first cavity etched into a surface of the silicon substrate; a second cavity etched into the surface of the silicon substrate a first dielectric layer covering the surface of the silicon substrate, the first cavity, and the second cavity; a first die affixed to the first cavity; a second die affixed to the second cavity, wherein the first die is distinct from the second die; a second dielectric layer at least partially covering the surface of the silicon substrate, an exposed surface of the first die, and an exposed surface of the second die, wherein the second dielectric layer is formed of an inorganic dielectric material; and a redistribution layer at least partially covering the second dielectric layer, wherein a first contact pad of the first die is electrically coupled to a second contact pad of the second die via one or more openings in the second dielectric layer.

Clause 16. The semiconductor wafer of clause 15, wherein the first die is a gallium arsenide die.

Clause 17. The semiconductor wafer of clause 15 or 16, further comprising: an additional semiconductor wafer, comprising: an additional silicon substrate; an additional first cavity etched into a surface of the additional silicon substrate; and an additional second cavity etched into the surface of the additional silicon substrate, wherein the semiconductor wafer and the additional semiconductor wafer are electrically coupled to form a stacked semiconductor structure.

Clause 18. The semiconductor wafer of any of clauses 15 through 17, wherein the stacked semiconductor structure comprises a through-silicon via (TSV) extending at least partially through the stacked semiconductor structure.

Clause 19. The semiconductor wafer of any of clauses 15 through 18, wherein at least one die of the stacked semiconductor structure is thermally coupled to a heat sink via the TSV.

Clause 20. The semiconductor wafer of any of clauses 15 through 19, wherein at least one die of the semiconductor wafer is electrically coupled to at least one die of the additional semiconductor wafer via a TSV.

Although the present disclosure has been described with reference to the embodiments illustrated in the attached drawing figures, it is noted that equivalents may be employed and substitutions made herein without departing from the scope of the present disclosure as recited in the claims.

Having thus described various embodiments of the present disclosure, what is claimed as new and desired to be protected by Letters Patent includes the following:

The invention claimed is:

1. A method for fabricating a semiconductor wafer via substrate embedment, the method comprising:
   etching a surface of a silicon substrate, based on a predetermined pattern, to form a first cavity and a second cavity;
   applying a first dielectric layer to the surface of the silicon substrate, the first cavity, and the second cavity;
   affixing a first die into the first cavity of the silicon substrate using a first adhesive;
   affixing a second die into the second cavity of the silicon substrate using a second adhesive;
   applying a second dielectric layer to the surface of the silicon substrate, an exposed surface of the first die, and an exposed surface of the second die;
   forming one or more openings in the second dielectric layer by:
      applying a first photoresist layer over the second dielectric layer;
      exposing at least a portion of the first photoresist layer to ultraviolet (UV) light;
      patterning at least a portion of the second dielectric layer such that a desired dielectric pattern is formed, wherein the desired dielectric pattern forms the one or more openings above the exposed surface of the first die and the exposed surface of the second die; and
      stripping remaining portions of the first photoresist layer from the second dielectric layer; and
   forming a redistribution layer over the second dielectric layer by:
      applying a metal layer over the second dielectric layer and the one or more openings;
      applying a second photoresist layer over the metal layer;
      exposing at least a portion of the second photoresist layer to UV light;
      patterning at least a portion of the metal layer such that a desired metal pattern is formed, wherein the desired metal pattern is configured to electrically couple the first die to the second die; and
      stripping remaining portions of the second photoresist layer from the metal layer.

2. The method of claim 1, wherein the first die is a distinct type of die from the second die.

3. The method of claim 2, wherein the first die is a gallium arsenide die.

4. The method of claim 1, wherein the surface of the silicon substrate is etched by deep reactive ion etching.

5. The method of claim 1, wherein the first dielectric layer is formed of thermal oxide.

6. The method of claim 1, wherein the second dielectric layer is formed of an inorganic dielectric material.

7. The method of claim 1, wherein the redistribution layer couples the first die to the second die via electrically coupling a first contact pad of the first die to a second contact pad of the second die.

8. A method for fabricating a semiconductor wafer via substrate embedment, the method comprising:
    etching a surface of a silicon substrate to form a first cavity and a second cavity;
    affixing a first die into the first cavity of the silicon substrate;
    affixing a second die into the second cavity of the silicon substrate, wherein the first die is distinct from the second die;
    applying a dielectric layer to the surface of the silicon substrate, an exposed surface of the first die, and an exposed surface of the second die, wherein the dielectric layer is an inorganic dielectric material;
    forming one or more openings in the dielectric layer by:
        applying a first photoresist layer over the dielectric layer;
        exposing at least a portion of the first photoresist layer to ultraviolet (UV) light;
        patterning at least a portion of the dielectric layer such that a desired dielectric pattern is formed, wherein the desired dielectric pattern forms the one or more openings above the exposed surface of the first die and the exposed surface of the second die; and
        stripping remaining portions of the first photoresist layer from the dielectric layer; and
    forming a redistribution layer over the dielectric layer by:
        applying a metal layer over the dielectric layer and the one or more openings;
        applying a second photoresist layer over the metal layer;
        exposing at least a portion of the second photoresist layer to UV light;
        patterning at least a portion of the metal layer such that a desired metal pattern is formed, wherein the desired metal pattern is configured to electrically couple the first die to the second die; and
        stripping remaining portions of the second photoresist layer from the metal layer.

9. The method of claim 8, wherein the inorganic dielectric material is plasma-enhanced tetraethyl orthosilicate (PE-TEOS).

10. The method of claim 8, wherein the first die is a silicon carbide die.

11. The method of claim 8, further comprising:
    etching the surface of the silicon substrate to form a third cavity;
    affixing a third die into the third cavity of the silicon substrate;
    applying the dielectric layer to an exposed surface of the third die;
    forming additional one or more openings in the dielectric layer applied to the exposed surface of the third die; and
    electrically coupling, via the redistribution layer, the third die to at least the first die or the second die.

12. The method of claim 8, further comprising:
    etching the surface of the silicon substrate to form a third cavity, wherein the third cavity extends at least partially through the silicon substrate to form a through-silicon via (TSV).

13. The method of claim 12, wherein the first die is thermally coupled to a heat sink via the TSV.

14. The method of claim 8, wherein the first die is affixed to the first cavity by anodic bonding.

15. A semiconductor wafer, comprising:
    a silicon substrate;
    a first cavity etched into a surface of the silicon substrate;
    a second cavity etched into the surface of the silicon substrate;
    a first dielectric layer covering the surface of the silicon substrate, the first cavity, and the second cavity;
    a first die affixed to the first cavity;
    a second die affixed to the second cavity, wherein the first die is distinct from the second die;
    a second dielectric layer at least partially covering the surface of the silicon substrate, an exposed surface of the first die, and an exposed surface of the second die, wherein the second dielectric layer is formed of an inorganic dielectric material; and
    a redistribution layer at least partially covering the second dielectric layer, wherein a first contact pad of the first die is electrically coupled to a second contact pad of the second die via one or more openings in the second dielectric layer.

16. The semiconductor wafer of claim 15, wherein the first die is a gallium arsenide die.

17. The semiconductor wafer of claim 15, further comprising:
    an additional semiconductor wafer, comprising:
        an additional silicon substrate;
        an additional first cavity etched into a surface of the additional silicon substrate; and
        an additional second cavity etched into the surface of the additional silicon substrate, wherein the semiconductor wafer and the additional semiconductor wafer are electrically coupled to form a stacked semiconductor structure.

18. The semiconductor wafer of claim 17, wherein the stacked semiconductor structure comprises a through-silicon via (TSV) extending at least partially through the stacked semiconductor structure.

19. The semiconductor wafer of claim 18, wherein at least one die of the stacked semiconductor structure is thermally coupled to a heat sink via the TSV.

20. The semiconductor wafer of claim 17, wherein at least one die of the semiconductor wafer is electrically coupled to at least one die of the additional semiconductor wafer via a TSV.

* * * * *